(12) United States Patent
Yanagimoto et al.

(10) Patent No.: US 12,429,509 B2
(45) Date of Patent: Sep. 30, 2025

(54) DIELECTRIC CHARACTERISTIC MEASUREMENT METHOD AND DIELECTRIC CHARACTERISTIC MEASUREMENT SYSTEM USING OPEN RESONATOR

(71) Applicant: EM labs, Inc., Hyogo (JP)

(72) Inventors: Yoshiyuki Yanagimoto, Hyogo (JP); Atsushi Hattori, Hyogo (JP)

(73) Assignee: EM labs, Inc., Hyogo (JP)

( * ) Notice: Subject to any disclaimer, the term of this patent is extended or adjusted under 35 U.S.C. 154(b) by 143 days.

(21) Appl. No.: 18/426,359

(22) Filed: Jan. 30, 2024

(65) Prior Publication Data
US 2024/0168071 A1    May 23, 2024

Related U.S. Application Data

(63) Continuation of application No. PCT/JP2022/039878, filed on Oct. 26, 2022.

(30) Foreign Application Priority Data
Nov. 23, 2021 (JP) ................................. 2021-189760

(51) Int. Cl.
*G01R 27/04* (2006.01)
*G01R 27/26* (2006.01)

(52) U.S. Cl.
CPC ..... *G01R 27/2658* (2013.01); *G01R 27/2641* (2013.01)

(58) Field of Classification Search
CPC .. G01N 22/00; G01N 27/026; G01N 27/2658; G01N 27/2641
See application file for complete search history.

(56) References Cited

U.S. PATENT DOCUMENTS 4,710,700 A * 12/1987 Osaki ................. G01R 27/2664
324/636
5,379,110 A    1/1995 Matsui et al.
(Continued)

FOREIGN PATENT DOCUMENTS

CN    211878079 U    11/2020
JP    S49-24341    3/1974
(Continued)

OTHER PUBLICATIONS

A. L. Cullen and P. K. Yu, The accurate measurement of permittivity by means of open resonator, Proc. R. Soc. Lond. A. 325, 493-509 (1971).

*Primary Examiner* — Thang X Le
(74) *Attorney, Agent, or Firm* — Yokoi & Co., U.S.A.; Toshiyuki Yokoi

(57) ABSTRACT

In a dielectric characteristic measurement method, a step of mounting a sample of which dielectric characteristic is measured on an open resonator and adjusting a position of the sample includes: a first measurement step for performing a first resonance measurement by sweeping a predetermined sweep frequency range at a first number of measurement points; and a second and subsequent measurement steps for performing a plurality times of resonance measurement following the first resonance measurement, wherein each of the plurality times of resonance measurement is performed by sweeping a sweep frequency range specified based on an immediately preceding resonance measurement at a second number of the measurement points which is less than the first number of the measurement points, and the sweep frequency range of a second resonance measurement in the plurality times of resonance measurement is specified based on the first resonance measurement.

8 Claims, 13 Drawing Sheets

(56) References Cited

U.S. PATENT DOCUMENTS

| | | | |
|---|---|---|---|
| 6,101,015 | A | 8/2000 | Budil et al. |
| 6,496,018 | B1 * | 12/2002 | Nagata .................. G01N 22/00 |
| | | | 324/636 |
| 6,864,690 | B1 | 3/2005 | Tidrow et al. |
| 9,013,191 | B2 * | 4/2015 | Potrepka ................ G01N 22/00 |
| | | | 324/636 |
| 2008/0148823 | A1 | 6/2008 | Peters et al. |
| 2016/0320317 | A1 * | 11/2016 | Wang .................... G01N 22/00 |
| 2021/0063332 | A1 | 3/2021 | Yanagimoto |

FOREIGN PATENT DOCUMENTS

| | | |
|---|---|---|
| JP | H05-142273 A | 6/1993 |
| JP | H09-205319 A | 8/1997 |
| JP | 2008-170432 A | 7/2008 |
| JP | 2012-47548 A | 3/2012 |
| JP | 2021-39039 A | 3/2021 |
| JP | 2021-181963 A | 11/2021 |
| JP | 2022-78723 A | 5/2022 |

\* cited by examiner

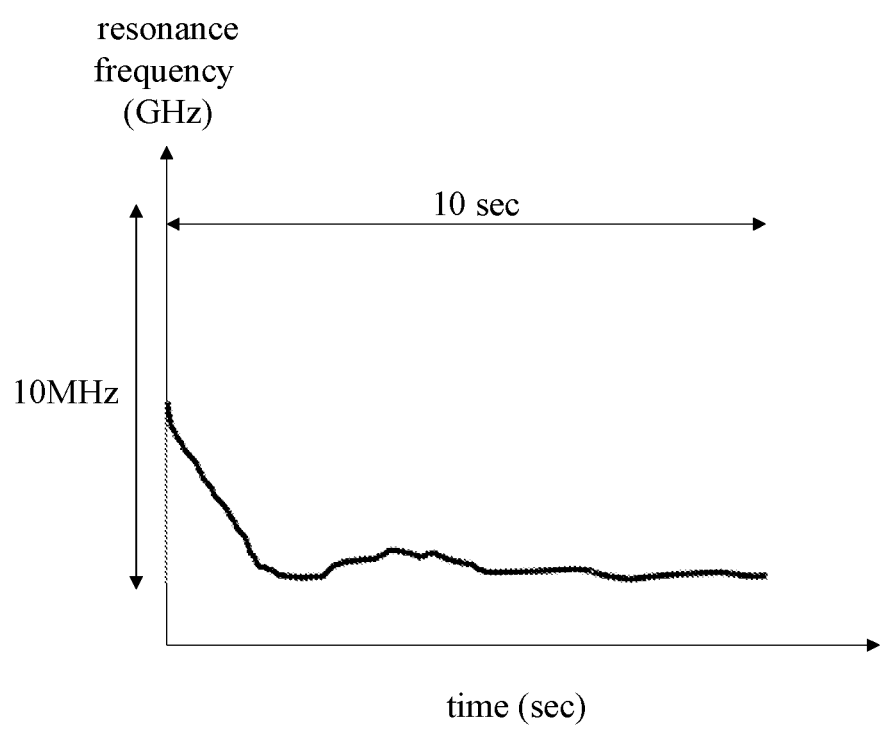

DIELECTRIC CHARACTERISTIC MEASUREMENT METHOD AND DIELECTRIC CHARACTERISTIC MEASUREMENT SYSTEM USING OPEN RESONATOR

CROSS-REFERENCE TO RELATED APPLICATIONS

This application claims the benefit of priority and is a Continuation application of the prior International Patent Application No. PCT/JP2022/039878, with an international filing date of Oct. 26, 2022, which designated the United States, and is related to the Japanese Patent Application No. 2021-189760, filed Nov. 23, 2021, the entire disclosures of all applications are expressly incorporated by reference in their entirety herein.

PRIOR ART

[Non-Patent Document 1] A. L. CULLEN and P. K. YU, The accurate measurement of permittivity by means of open resonator, Proc. R. Soc. Lond. A. 325, 493-509 (1971)

BACKGROUND OF THE INVENTION

The present invention relates to a dielectric characteristic measurement method and a dielectric characteristic measurement system using an open resonator suitable for measuring dielectric characteristic (real part (relative dielectric constant E') of complex relative dielectric constant and dielectric tangent (tan δ)) of a dielectric material.

In the application fields of an on-vehicle radar, an optical communication, a high-speed digital equipment and the like, the frequency in the millimeter wave band is used. It is necessary to improve the position resolution in the radar, increase the communication speed in the optical communication and accelerate the processing in the digital equipment. Thus, it is assumed that the frequency of the millimeter wave to be used is further increased. Currently, the frequency bands of 75-80 GHz, 50 GHz and 40 GHz are used in the most advanced equipment. The frequency range exceeding 100 GHz is assumed in future. In addition, the discussion is held assuming to use the band up to 330 GHz in the sixth-generation communication system (6G) coming next to the fifth-generation communication system (5G). Accordingly, the measurement using higher frequency is required when measuring the material characteristic used for the above described equipment. In the material characteristic, a major problem is energy loss in the millimeter wave caused by high frequency. Thus, it is necessary to solve the problem about the measurement of the dielectric characteristic of the material.

In the measurement of the dielectric characteristic in the millimeter wave band, the reduction of the energy loss is the particularly important purpose to be developed. Thus, the measurement of the dielectric tangent (loss factor, tan δ) is important and the measurement using the resonator is mainly used in the conventional manner. A split cylinder resonator is a typical equipment for performing the above described measurement. The split cylinder resonator is used for measuring the dielectric tangent of low loss materials in the upper limit of approximately 60 GHz. However, it is difficult for the split cylinder resonator to correctly measure the dielectric characteristic in the frequency higher than 60 GHz. An open resonator (Fabry-Perot resonator) is suitable in the frequency higher than 60 GHz (Non-Patent Document 1).

In the Fabry-Perot resonator, a sample processed in in a film shape is inserted into a resonator and a network analyzer is frequently used for the measurement. The network analyzer is connected to the resonator. A graph indicating a frequency as a horizontal axis and a transmission signal intensity (transmission coefficient) as a vertical axis is obtained to obtain the resonance characteristics. Here, "resonance characteristics" mean the center frequency (resonance frequency) of the resonance and Q value (ratio between center frequency and 3 dB band width in the specification of the present invention). In general, the relative dielectric constant and the dielectric tangent of the sample are obtained from the resonance characteristics with/without the sample by calculation or simulation.

SUMMARY OF THE INVENTION

The present invention provides a dielectric characteristic measurement method and a dielectric characteristic measurement system using an open resonator capable of adjusting the position of the sample of which the dielectric characteristic is measured with high accuracy.

The dielectric characteristic measurement method of the present disclosure is the method for measuring dielectric characteristic of a sample using an open resonator while adjusting a position of the sample. The dielectric characteristic measurement method includes: a step of obtaining first resonance characteristic in a state that the sample is not mounted on the open resonator; a step of mounting the sample on the open resonator and adjusting the position of the sample; a step of obtaining second resonance characteristic in a state that the position of the sample is adjusted; and a step of calculating the dielectric characteristic of the sample based on the first resonance characteristic and the second resonance characteristic. The step of adjusting the position of the sample includes: a first measurement step for performing a first resonance measurement by sweeping a predetermined sweep frequency range at a first number of measurement points; and a second and subsequent measurement steps for performing a plurality times of resonance measurement following the first resonance measurement, wherein each of the plurality times of resonance measurement is performed by sweeping a sweep frequency range specified based on an immediately preceding resonance measurement at a second number of the measurement points which is less than the first number of the measurement points, and the sweep frequency range of a second resonance measurement in the plurality times of resonance measurement is specified based on the first resonance measurement.

A dielectric characteristic measurement system of the present disclosure includes an open resonator having a sample stand on which a sample is mounted to measure a dielectric characteristic of the sample, a signal injection portion and a signal detection portion; a network analyzer configured to perform a resonance measurement by transmitting a signal to the signal injection portion and receiving the signal from the signal detection portion; and a controller configured to control the network analyzer. In a step of adjusting a position of the sample mounted on the sample stand, the controller is configured to control the network analyzer to perform a first resonance measurement by sweeping a predetermined sweep frequency range at a first number of measurement points, perform a plurality times of resonance measurement following the first resonance measurement by sweeping a sweep frequency range specified based on an immediately preceding resonance measurement at a second number of the measurement points which is less than the first number of the measurement points so that the sweep frequency range of a second resonance measurement in the plurality times of resonance measurement is specified based on the first resonance measurement.

When the dielectric characteristic measurement method or the dielectric characteristic measurement system using the open resonator of the present disclosure is used, it is possible to adjust the position of the sample of which the dielectric characteristic is measured with high accuracy even by an unskilled operator.

BRIEF DESCRIPTION OF DRAWINGS

FIG. 7B is a drawing showing the relation between the time and the resonance frequency (auto scale) for supporting the position adjustment of the sample in the Fabry-Perot resonator concerning the embodiment 1.

DETAILED DESCRIPTION OF THE INVENTION

Embodiment 1

Figure 1:
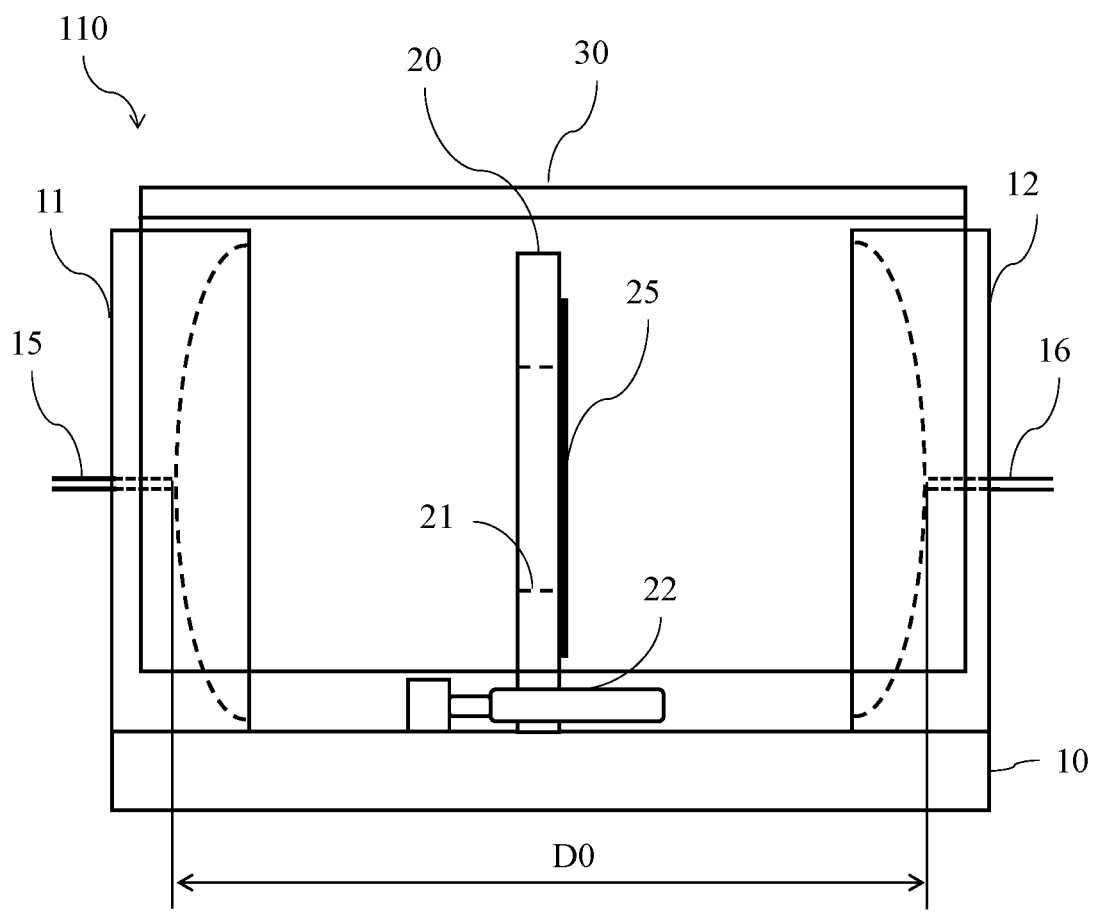
FIG. 1 is a schematic diagram of a Fabry-Perot resonator concerning the embodiment 1.

FIG. 1 is a schematic diagram of a Fabry-Perot resonator 110 concerning the embodiment 1. As shown in FIG. 1, the Fabry-Perot resonator 110 includes a fixing stand 10, a first spherical reflection mirror 11, a second spherical reflection mirror 12, a sample stand 20, a micrometer 22 and a cover 30. The Fabry-Perot resonator 110 is an example of the open resonator. In the following explanation, the explanation will be made by using the XYZ coordinate system shown in FIG. 1. The X-direction corresponds to the up-down direction, the Y-direction corresponds to the front-rear direction and the Z-direction corresponds to the left-right direction.

As shown in FIG. 1, the first spherical reflection mirror 11 and the second spherical reflection mirror 12 are arranged on the fixing stand 10 at a predetermined distance D0 from each other. A first waveguide 15 and a second waveguide 16 are formed on the center of the first spherical reflection mirror 11 and the second spherical reflection mirror 12 respectively. Coupling holes having a minute diameter are formed respectively on front end opening portions (spherical surface side) of the first waveguide 15 and the second waveguide 16 to form a coupled state for obtaining desired resonance characteristics. The first waveguide 15 of the first spherical reflection mirror 11 is a signal injection portion to input a measurement signal for measuring the dielectric characteristic of the sample from the first waveguide 15. The second waveguide 16 of the second spherical reflection mirror 12 is a signal detection portion to output the detection signal from the second waveguide 16.

The sample stand 20 includes a through hole 21. The sample stand 20 is arranged between the first spherical reflection mirror 11 and the second spherical reflection mirror 12 which face each other. The sample stand 20 is a holder for mounting a sample 25 on the sample stand 20 so that the dielectric characteristic of the sample 25 is measured. The sample 25 is mounted so that the sample 25 covers the through hole 21. The micrometer 22 is mounted for adjusting the position of the sample 25 mounted on the sample stand 20 in the left-right direction (Z-direction). The micrometer 22 is a position adjustment mechanism capable of adjusting the position of the sample 25 mounted on the sample stand 20 by adjusting the position of the sample stand 20 in the Z-direction with respect to the fixing stand 10 (i.e., the first spherical reflection mirror 11 and the second spherical reflection mirror 12).

Figure 2:
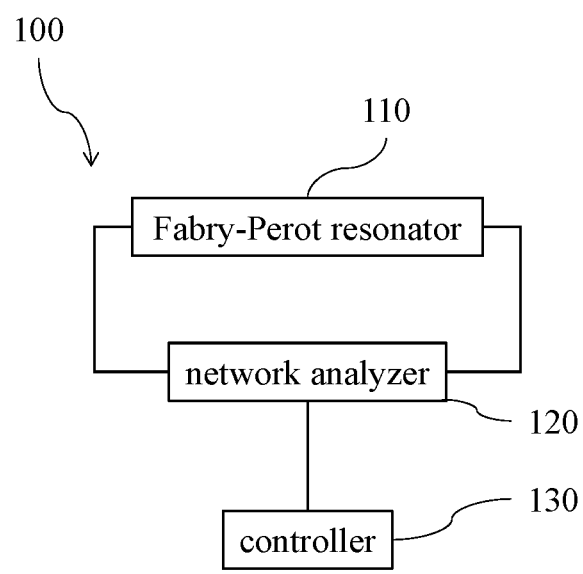
FIG. 2 is a block diagram of a dielectric characteristic measurement system using the Fabry-Perot resonator concerning the embodiment 1.

FIG. 2 is a block diagram of a dielectric characteristic measurement system 100 using the Fabry-Perot resonator 110. As shown in FIG. 2, the dielectric characteristic measurement system 100 includes the Fabry-Perot resonator 110, a network analyzer 120 and a controller 130 provided with a not-illustrated monitor.

The network analyzer 120 outputs a millimeter-wave to input the millimeter-wave into the first waveguide 15 which is the signal injection portion of the Fabry-Perot resonator 110. In addition, the network analyzer 120 detects the millimeter-wave inputted into the first waveguide 15 and transmitted through the Fabry-Perot resonator 110 from the second waveguide 16 which is the signal detection portion of the Fabry-Perot resonator 110. Furthermore, the network analyzer 120 displays a waveform (graph) indicating a frequency as a horizontal axis and a transmission attenuation (transmission coefficient) as a vertical axis on a display unit in accordance with the millimeter-wave outputted from the network analyzer 120 and the millimeter-wave transmitted through the Fabry-Perot resonator 110.

(Measurement of Dielectric Characteristic)

The steps of the measurement of the dielectric characteristic measured by the Fabry-Perot resonator 110 are shown below.

1) The Fabry-Perot resonator 110, the network analyzer 120 and the controller 130 are connected with each other via a cable.
2) In a state that the sample is not mounted (without the sample), the resonance characteristic (first resonance characteristic) is measured in the resonance frequency to be measured. The Q value $Q_{empty}$ is calculated from a band width of a resonance waveform.
3) The resonances (resonance frequencies) are measured at five points including the frequency to be measured and the frequencies before and behind it. The distance D0 between the spherical reflection mirrors is calculated from the resonance frequencies of the five points.
4) After the cover 30 of the Fabry-Perot resonator 110 is detached and the sample 25 is mounted on the sample stand 20, a space between the first spherical reflection mirror 11 and the second spherical reflection mirror 12 is covered with the cover 30.
5) The micrometer 22 is operated to adjust the position of the sample 25. Namely, the position of the sample 25 is aligned with the position where the resonance frequency becomes the minimum.
6) In a state that the position of the sample 25 is adjusted (with sample), the resonance characteristic (second resonance characteristic) is measured in the resonance frequency to be measured. The center frequency (resonance frequency $F_{sample}$) and the Q value $Q_{sample}$ are calculated for the resonance shifted by inserting the sample 25.
7) The relative dielectric constant ε' and the dielectric tangent tan δ of the sample are calculated from the thickness t of the sample 25, the distance D0, the Q value $Q_{empty}$ measured without the sample, the resonance frequency $F_{sample}$ measured with the sample and the Q value $Q_{sample}$ measured with the sample.

When measuring the dielectric characteristic in a plurality of frequencies for the same sample 25, after the above described step 1), the above described steps 2) and 3) are performed for all frequencies to be measured. Then, after the above described steps 4) and 5) are performed, the above described steps 6) and 7) are performed for all frequencies to be measured.

Figure 3A:
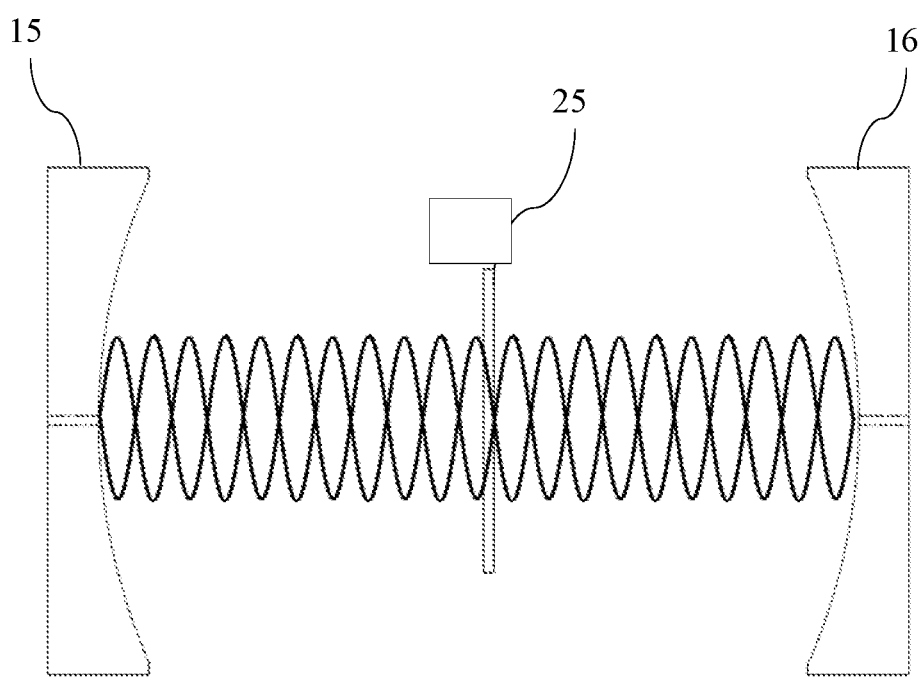
FIG. 3A is a schematic diagram for explaining a position adjustment of a sample in the Fabry-Perot resonator (before position adjustment).
Figure 3B:
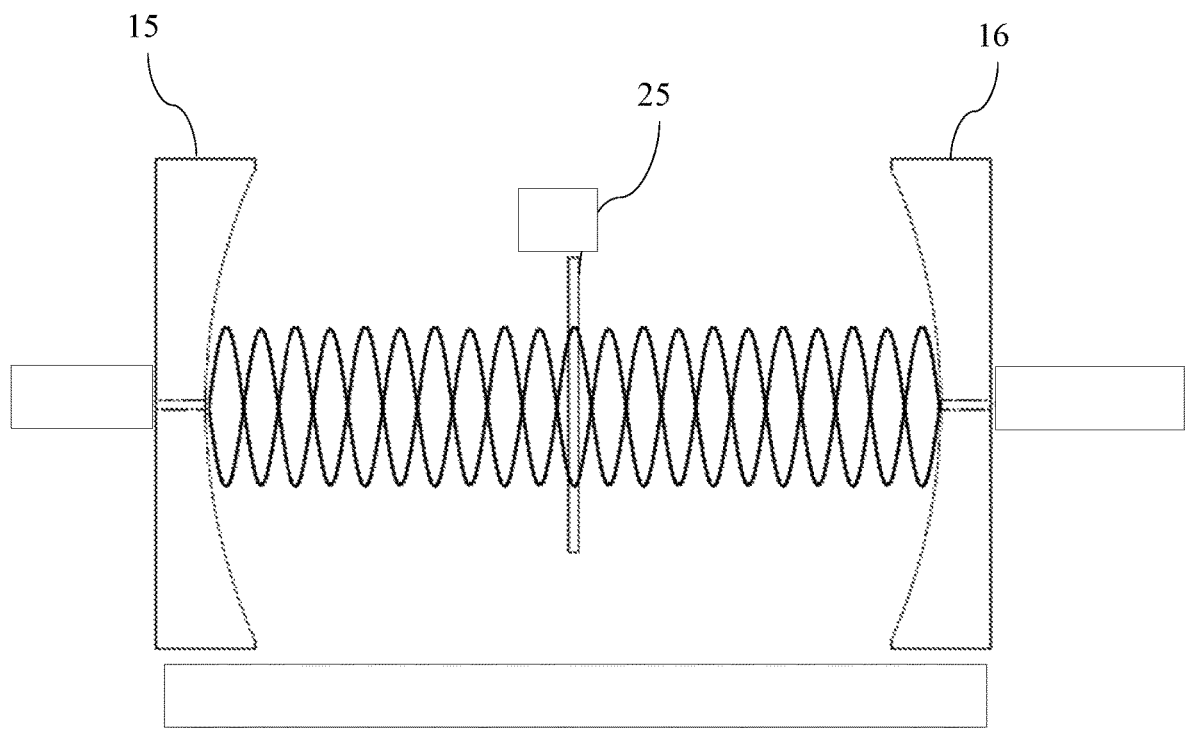
FIG. 3B is a schematic diagram for explaining the position adjustment of the sample in the Fabry-Perot resonator (position adjustment is finished).

In the above described step 5), the position of the sample 25 in the left-right direction (Z-direction) is adjusted so that the resonance frequency becomes the minimum. For measuring the dielectric characteristic by the Fabry-Perot resonator, it is required to align the center of the sample 25 in the Z-direction with the position where the electric field of the standing wave caused by the resonance is the strongest (i.e., the center of the antinode (amplitude) located at the center of the resonance). At that time, the resonance frequency receives the effect of the sample 25 at the maximum and shifts to the low frequency side at the maximum. For measuring the dielectric characteristic correctly, it is required to adjust the position of the sample 25 so that resonance frequency becomes the minimum. Since the thickness is different depending on each sample 25, it is necessary to align the position of the sample 25 before measuring the resonance characteristic. FIG. 3A is a schematic diagram for explaining a state that the position of the sample 25 is not aligned with the center of the antinode (amplitude) located at the center of the resonance, while FIG. 3B is a schematic diagram for explaining a state that the position of the sample 25 is aligned with the center of the antinode (amplitude) located at the center of the resonance.

Figure 4A:
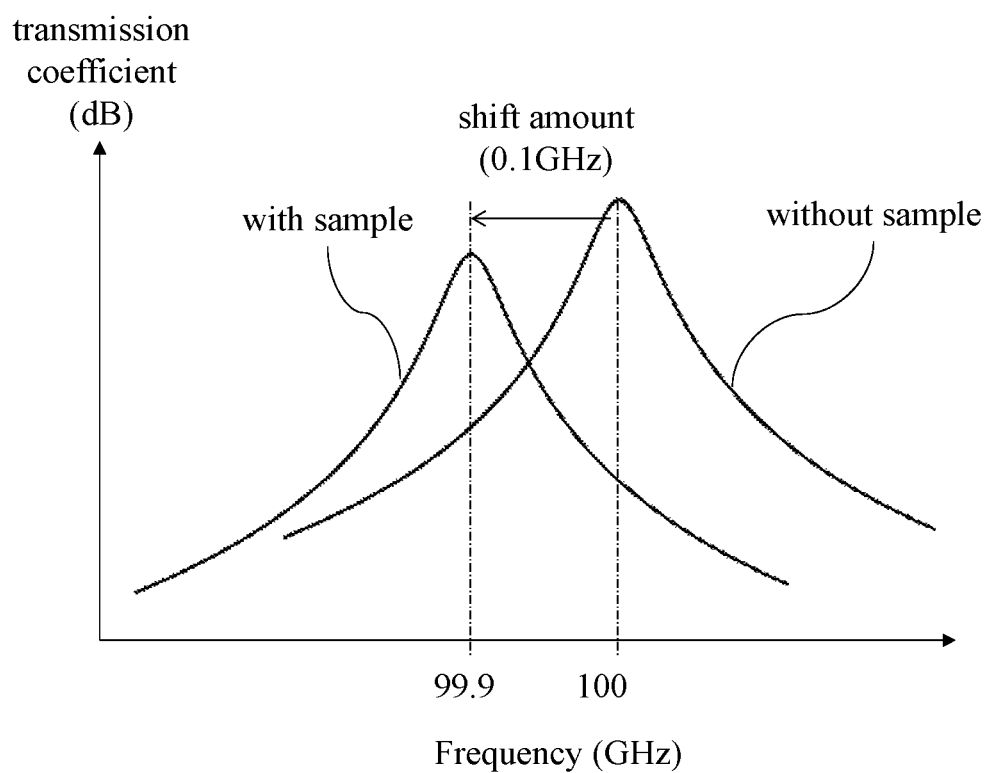
FIG. 4A is a drawing showing a shift from the resonance frequency without the sample to the resonance frequency with the sample in the Fabry-Perot resonator.

As described above, in the above described step 5), whether or not the position adjustment of the sample 25 is finished is judged by determining whether or not the resonance frequency becomes the minimum. When the relative dielectric constant of the sample 25 is E' and the thickness of the sample 25 is t, it is known that the shift amount from the resonance frequency without the sample 25 to the resonance frequency with the sample 25 is approximately proportional to $(\sqrt{(\varepsilon')}-1) \times t$. For example, in case of the polyimide which is a typical sample having the relative dielectric constant ε' of 3.5 and the thickness t of 50 μm, the resonance frequency is 100 GHz without the sample 25 while the resonance frequency is reduced by approximately 100 MHz (0.1 GHz) when the position of the sample 25 is appropriately adjusted (shown in FIG. 4A). Namely, the shift amount of the resonance frequency is approximately 100 MHz in this case. In order to adjust the position of the sample 25 so that the resonance frequency becomes the minimum, it is required to perform the resonance measurement by sweeping the frequency by the dielectric characteristic measurement system 100 and adjust (shift) the position of the sample 25 while checking the resonance frequency.

Figure 4B:
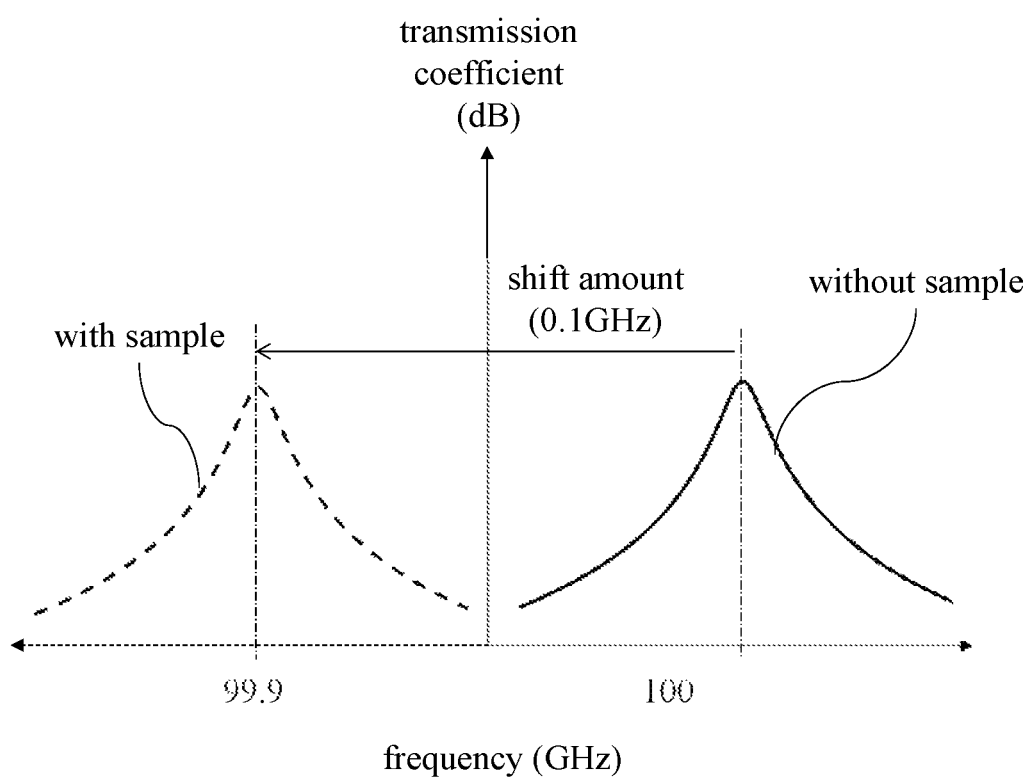
FIG. 4B is a drawing showing a movement from the resonance frequency without the sample to the resonance frequency with the sample in the Fabry-Perot resonator (excessively high resolution).
Figure 4C:
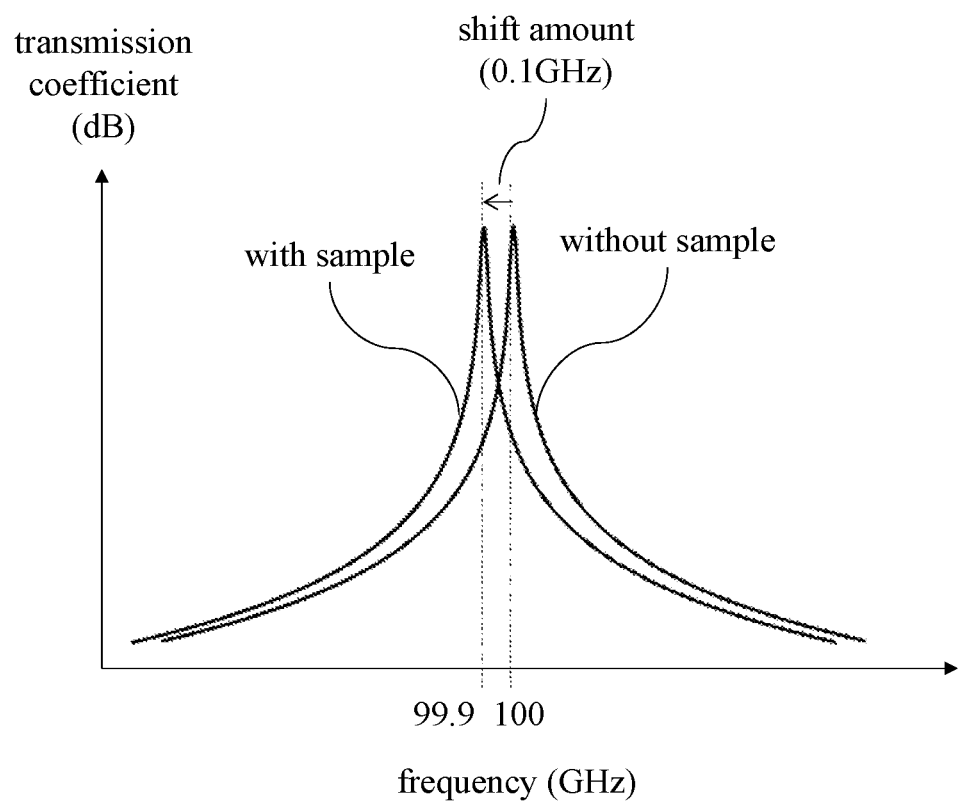
FIG. 4C is a drawing showing a movement from the resonance frequency without the sample to the resonance frequency with the sample in the Fabry-Perot resonator (excessively low resolution).

In addition, in order to determine the minimum value of the resonance frequency precisely, it is required to reduce a sweep frequency width of the frequency displayed on the horizontal axis of the waveform (resonance waveform) indicating the resonance and enlarge the horizontal axis. However, if the horizontal axis is excessively enlarged, the waveform indicating the resonance deviates from the display screen and the minimum value of the resonance frequency cannot be determined (shown in FIG. 4B). On the contrary, if the sweep frequency width is excessively enlarged and the horizontal axis is excessively reduced, the resolution becomes too low and it is difficult to determine the minimum value of the resonance frequency precisely (shown in FIG. 4C).

If the resonance frequency is not adjusted to the minimum value, it cannot be said that the position of the sample is adjusted to the appropriate position. Thus, an error is generated on the relative dielectric constant and other values calculated in the above described step 7). The allowance range of the error in the relative dielectric constant is approximately 1% in accordance with market demand. The measurement error caused by the position adjustment of the sample 25 should be 0.1% or less. For example, when the shift amount of the resonance frequency is approximately 100 MHz in the above described example, the resonance frequency should be measured with accuracy of 0.1 MHz or less for determining the position adjustment of the sample 25.

As described above, in order to adjust the position of the sample 25 while displaying the resonance waveform indicating the frequency as the horizontal axis so that the resonance frequency becomes the minimum, it is required to change the settings of frequency of the network analyzer 120 (settings of the center frequency and the sweep frequency width) many times. Such operation is difficult for the operator and a lot of time is required. In the embodiment 1, a graph indicating the time as the horizontal axis and the frequency as the vertical axis is displayed on the monitor so that the time-series changes of the resonance frequency changed by the adjustment of the position of the sample 25 can be checked. The frequency setting of the network analyzer is automatically specified by a controller to follow the resonance frequency which always shifts when the operator adjusts the position of the sample 25 so that the measured resonance frequency is always located within the range of the sweep frequency.

In the resonance measurement using the dielectric characteristic measurement system 100 of the embodiment 1, the operator operates the micrometer 22 to adjust the position of the sample 25 while visually recognizing the shift of the resonance frequency shown in the graph displayed on the monitor. Thus, it is preferable to reflect the resonance frequency measured corresponding to the position of the sample 25 on the graph as soon as possible. In the dielectric characteristic measurement system 100, since the resonance frequency measured corresponding to the position adjustment of the sample 25 is reflected in a real time (i.e., the measurement of the resonance frequency measured in accordance with the shift of the position of the sample 25 is sufficiently short compared to the time required for shifting the position of the sample 25), the number of the measurement points (the number of the data points) is significantly reduced and the time (sweep time) required for one sweeping is specified to be less than 0.05 seconds.

Figure 5:
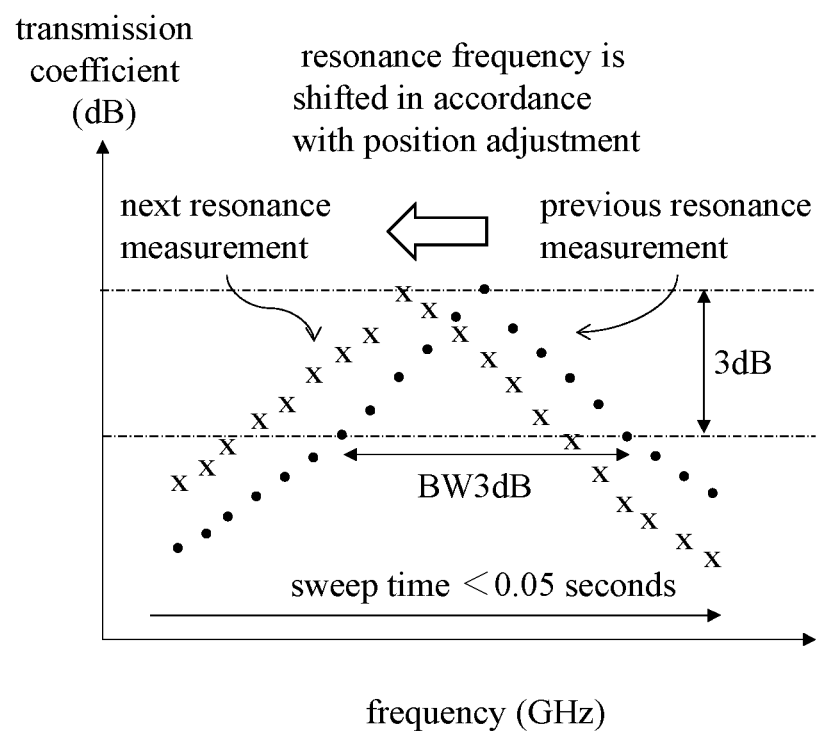
FIG. 5 is a drawing showing a measurement result of a transmission coefficient with respect to a frequency when the number of the measurement points is reduced in the Fabry-Perot resonator concerning the embodiment 1.

In the example shown in FIG. 5, in order to set the sweep time less than 0.05 seconds, the interval of the frequency to be measured is specified so that the number of the measurement points for the sweep frequency width of one sweeping is 20, which is an example of the second number of the measurement points. In general, when the number of the measurement points is reduced, the interval of the frequency to be measured becomes larger and the resolution of the frequency is reduced. Thus, the measurement accuracy of the resonance frequency tends to be deteriorated. In the dielectric characteristic measurement system 100, the sweep frequency width of the next resonance measurement is specified to 2 times of a 3 dB band width $BW_{3dB}$ (the frequency width where the difference from the peak value of the transmission coefficient corresponding to the resonance frequency is 3 dB) in the resonance waveform of the immediately preceding resonance measurement (previous resonance measurement). The number of the measurement points is specified to be 20 for the sweep frequency width specified as described above to secure the resolution of the frequency sufficiently. In addition, the sweep time is specified to be less than 0.05 seconds to perform the resonance measurement in a real time. Since the sweep frequency width and the number of the measurement points are combined as described above, even when the resonance frequency is shifted in accordance with the position adjustment of the sample 25, the resonance frequency to be measured does not deviate from the sweep frequency range and the resonance frequency can be measured with sufficient resolution of the frequency.

The frequency of the network analyzer is automatically specified by the controller based on the resonance waveform measured in the previous resonance measurement. Specifically, as for the center frequency in the frequency setting of the network analyzer, the resonance frequency measured in the previous resonance measurement is specified as the center frequency in the next resonance measurement. As for the sweep frequency width, 2 times of the 3 dB band width $BW_{3dB}$ of the resonance waveform measured in the previous resonance measurement is specified as the next sweep frequency width. Since the center frequency and the sweep frequency width are specified, the sweep frequency range of the next resonance measurement is determined. As described above, the frequency setting of the network analyzer is automatically performed and the number of the measurement points in the sweep frequency width is specified to be 20 points. Because of this, even when the position of the sample 25 is adjusted in a real time, the resonance frequency changed in accordance with the adjustment does not deviate from the sweep frequency range and the resonance frequency can be measured with required accuracy (0.1 MHz or less in the example of the embodiment 1).

Figure 6:
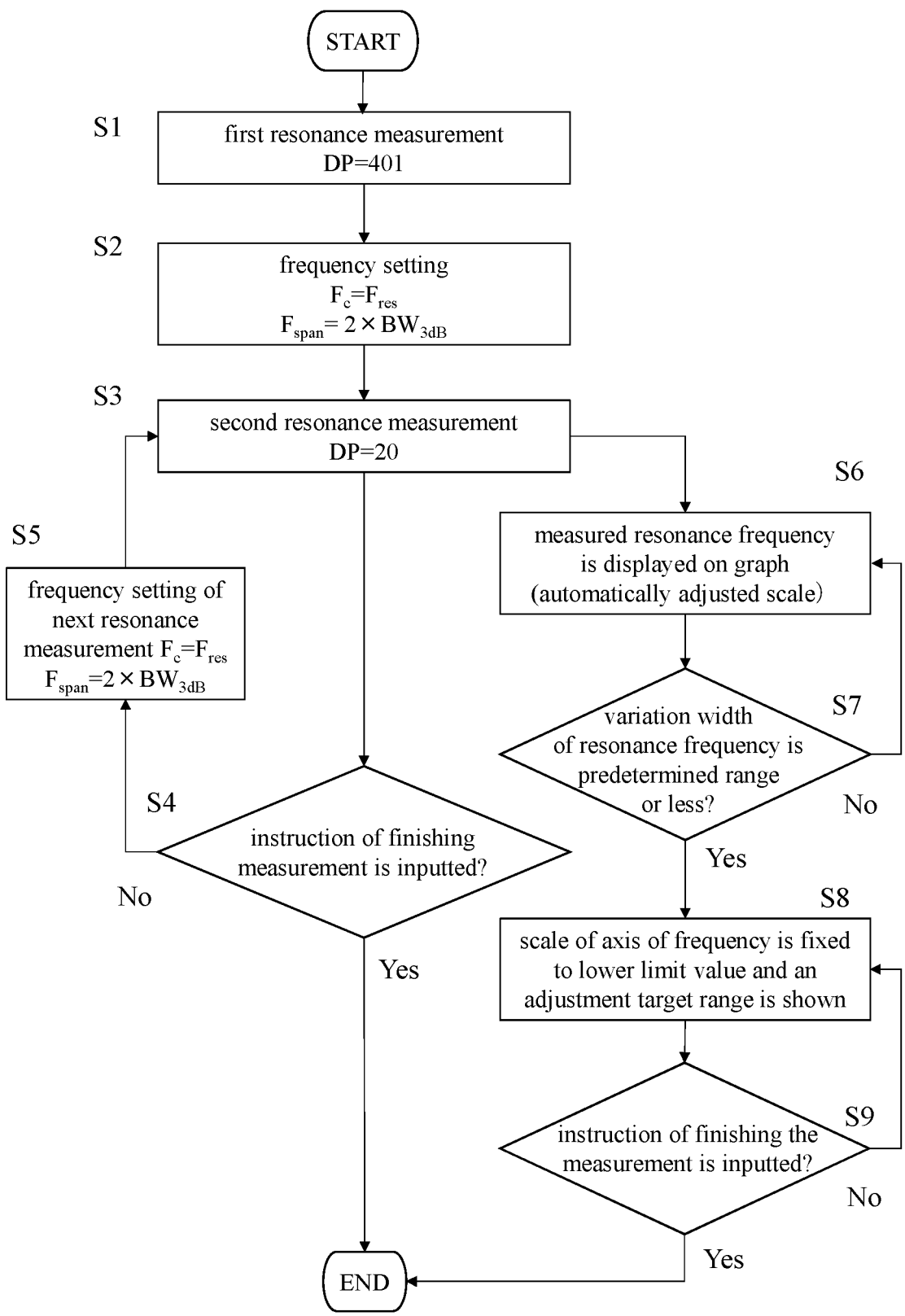
FIG. 6 is a flowchart showing a method of the position adjustment of the sample in the Fabry-Perot resonator concerning the embodiment 1.

Next, the method of adjusting the position of the sample in the measurement of the dielectric characteristic using the dielectric characteristic measurement system 100 will be specifically explained. FIG. 6 is a flowchart showing the method of the position adjustment of the sample in the measurement of the dielectric characteristic using the dielectric characteristic measurement system 100.

In a state that the sample 25 is mounted on the sample stand 20 of the Fabry-Perot resonator 110, the operator operates the controller to perform the frequency setting of the network analyzer 120 (settings of center frequency $F_c$ and sweep frequency width $F_{span}$). For example, when the resonance frequency without the sample 25 (empty state) is 100 GHz and the sample 25 is the polyimide (thickness t: 50 µm), the center frequency $F_c$ is specified to be 99.9 GHz and the sweep frequency width $F_{span}$ is specified to be 200 MHz (99.8 to 100 GHz). In addition, the interval of the frequency with respect to the sweep frequency width is specified to be 0.5 MHz and the number of the measurement points DP is specified to be 401 points (an example of the first number of the measurement points). In the first resonance measurement, since the data for setting the sweep frequency width of the second resonance measurement is required, the first sweep frequency width in the first resonance measurement is specified relatively wide as 200 MHz and the number of the measurement points DP is specified relatively large as 401 points. By using the above described settings, the measurement of the resonance frequency (first resonance measurement) corresponding to the position of the mounted sample 25 is performed (S1). In the first resonance measurement, since the number of the measurement points DP is 401 points and large, one second or more is required as the sweep time.

Then, the frequency setting of the network analyzer 120 used for the second resonance measurement is performed based on the resonance waveform obtained in the first resonance measurement (S2). Specifically, the resonance frequency $F_{res}$ measured by the first resonance measurement is specified as the center frequency $F_c$, while 2 times of the 3 dB band width $BW_{3dB}$ of the resonance waveform obtained by the first resonance measurement is specified as the sweep frequency width $F_{span}$ of the second resonance measurement (S2).

After the frequency setting is performed in Step S2, the second resonance measurement is performed by the frequency setting specified above. The second resonance measurement is performed as one of the second and subsequent resonance measurements (S3). In the second and subsequent resonance measurements, in order to set the sweep time less than 0.05 seconds, the interval of the frequency to be measured is specified so that the number of the measurement points for the sweep frequency width of one sweeping is 20 points. The number of the measurement points DP in the second and subsequent resonance measurements is 20 points which is equal to or less than one-twentieth of 401 points which is the number of the measurement points DP in the first resonance measurement.

Once the second and subsequent resonance measurement in Step S3 is started, the controller 130 monitors whether or not the instruction of finishing the measurement is inputted (S4). When the instruction of finishing the measurement is not inputted (No in S4), the controller 130 performs the frequency setting for the next resonance measurement based on the resonance waveform obtained in the previous resonance measurement in the second and subsequent resonance measurements of Step S3 (S5). Specifically, the resonance frequency $F_{res}$ measured by the previous resonance measurement is specified as the center frequency $F_c$, while 2 times of the 3 dB band width $BW_{3dB}$ of the resonance waveform obtained by the previous resonance measurement is specified as the sweep frequency width $F_{span}$ of the next resonance measurement (S5).

After the frequency setting is performed in Step S5, the process is returned to Step S3 and the second and subsequent resonance measurement is performed again. When the frequency setting is performed for the third resonance measurement based on the second resonance measurement in Step S5, the second and subsequent resonance measurement of the next Step S3 is the third resonance measurement. When the instruction of finishing the measurement is inputted (Yes in S4), the controller 130 finishes the resonance measurement. Namely, the controller 130 repeatedly performs the frequency setting for the next resonance measurement based on the resonance waveform obtained by the previous resonance measurement, updates the frequency setting each time, and performs the resonance measurement (a plurality times of resonance measurement) until the instruction of finishing the measurement is inputted in Step S4. The number of the measurement points DP in the second and subsequent resonance measurements is 20 points and each of the second and subsequent resonance measurements is performed within less than 0.05 seconds.

Figure 7A:
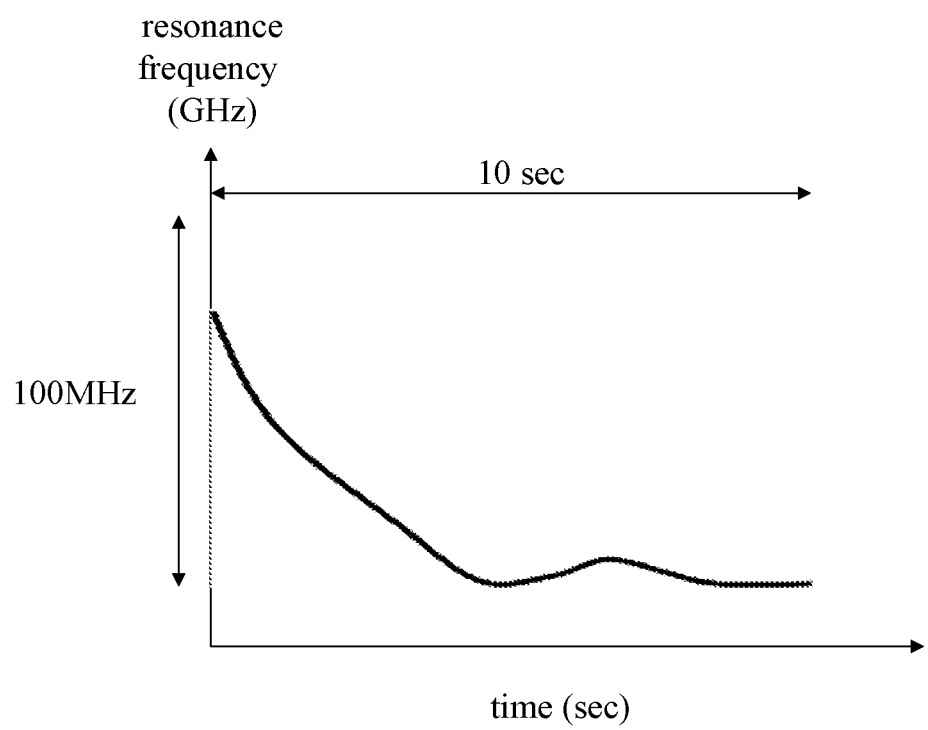
FIG. 7A is a drawing showing the relation between the time and the resonance frequency (initial) for supporting the position adjustment of the sample in the Fabry-Perot resonator concerning the embodiment 1.

Once the second and subsequent resonance measurement in Step S3 is started, the controller 130 displays the graph indicating the time as the horizontal axis and the resonance frequency (the resonance frequency measured in the second and subsequent resonance measurement) as the vertical axis on the monitor as shown in FIG. 7A (S6). As described above, when the resonance frequency of the empty state is 100 GHz and the sample 25 is the polyimide (thickness t: 50 μm), the shift amount of the resonance frequency is approximately 100 MHz. Since the resonance frequency is measured within the above described range when the position of the sample 25 is adjusted, the frequency width in the vertical axis is initially specified to approximately 100 MHz, for example (initial setting).

Figure 7C:
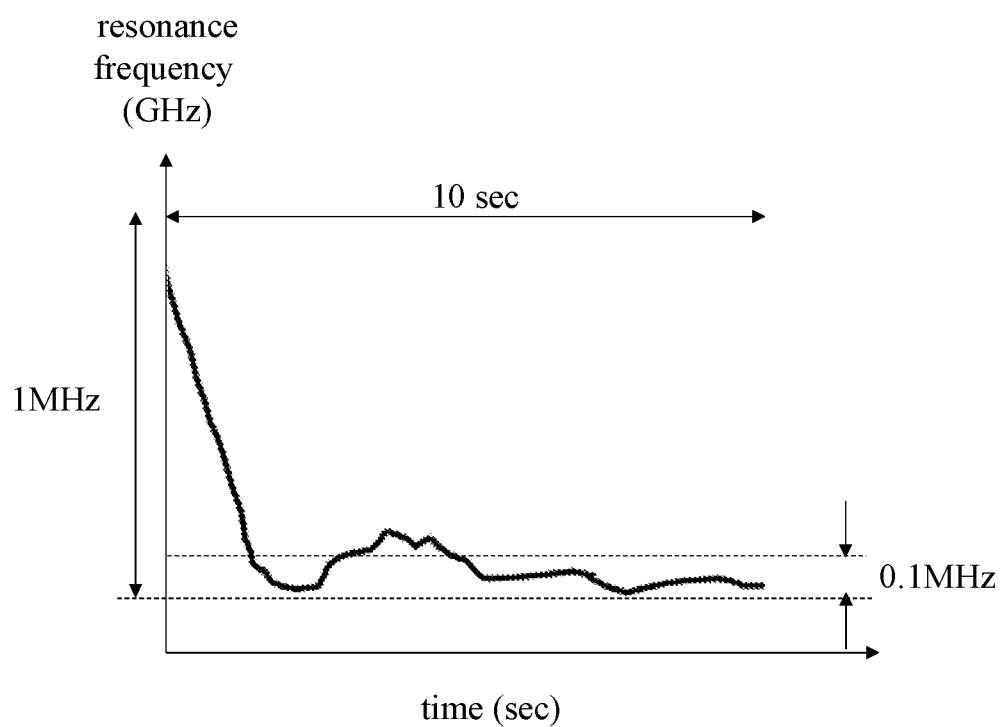
FIG. 7C is a drawing showing the relation between the time and the resonance frequency (lower limit value) for supporting the position adjustment of the sample in the Fabry-Perot resonator concerning the embodiment 1.

At this time, the time of the horizontal axis is 10 seconds as shown in FIG. 7A to FIG. 7C. Namely, the change of the resonance frequency measured in the most recent 10 seconds is shown in the graph. In addition, the scale of the range of the frequency shown in the vertical axis is specified to be automatically adjusted. Namely, the scale of the frequency in the vertical axis is automatically updated so that the range (the range from the minimum value to the maximum value) of the resonance frequency measured in the most recent 10 seconds is fit to the display range of the vertical axis of the graph. For example, when the variation width of the resonance frequency measured in the most recent 10 seconds is 9 MHz which is slightly lower than 10 MHz, the frequency width in the vertical axis of the graph is automatically changed to 10 MHz in accordance with the value of the measured frequency as shown in FIG. 7B.

Then, the controller 130 determines whether or not the variation width of the resonance frequency measured in a most recent predetermined time period is within a predetermined range (within the first predetermined value) (S7). Namely, the controller 130 determines whether or not the difference (variation width) between the maximum value and the minimum value of the resonance frequency measured in the most recent 10 seconds is within the predetermined range. When the variation width is not within the predetermined range (No in S7), the process is returned to Step S6 and the controller 130 continues to display the graph while the scale of the frequency in the vertical axis is specified to be automatically adjusted. When the resonance frequency of the empty state is 100 GHz and the sample 25 is the polyimide (thickness t: 50 μm), the shift amount of the resonance frequency is approximately 100 MHz. Thus, the first predetermined value is specified to 1 MHz which is 1% of 100 MHz, for example (shown in FIG. 7C).

When the variation width of the resonance frequency measured in the most recent 10 seconds in Step S3 is equal to or less than the predetermined range (Yes in Step S7), the controller 130 fixes the width (scale) of the frequency shown in the vertical axis of the displayed graph to the first predetermined value (lower limit value) and an adjustment target range is shown in the graph as shown in FIG. 7C (S8). The adjustment target range is the range from the minimum value of the measured resonance frequency to the second predetermined value. As described above, when the resonance frequency of the empty state is 100 GHz and the sample 25 is the polyimide (thickness t: 50 μm), the shift amount of the resonance frequency is approximately 100 MHz. Thus, the second predetermined value is specified to 0.1 MHz which is 0.1% of 100 MHz, for example (shown in FIG. 7C).

Once the second and subsequent resonance measurement in Step S2 is started, the operator confirms the graph shown in FIG. 7A to 7C and adjusts the position of the sample 25 by operating the micrometer so that the resonance frequency shown in the graph becomes minimum. In particular, when the graph shown in FIG. 7C is displayed in Step S8, the position of the sample 25 is adjusted so that the resonance frequency is located within the adjustment target range shown in the graph. The finish of the position adjustment operation can be determined by confirming that the resonance frequency is located within the adjustment target range. The graph is continued to be displayed until the instruction of finishing the measurement is inputted (No in S9). When the position adjustment operation is finished and the instruction of finishing the measurement is inputted (Yes in S9), the resonance measurement is finished and the update of the displayed graph is finished.

As shown in FIG. 7C, the controller 130 displays the graph indicating the time as the horizontal axis and the frequency as the vertical axis on the monitor. The range of the frequency shown in the vertical axis is reduced from 100 MHz to approximately 1 MHz and the vertical axis is enlarged as shown in the graphs shown in FIG. 7A to FIG. 7C. This is because it is difficult to adjust the position of the sample 25 with sufficient accuracy in a state that the range of the frequency displayed on the vertical axis is 100 MHz when the resonance frequency shifting in the range of approximately 100 MHz is adjusted with the accuracy of approximately 0.1 MHz.

Figure 8:
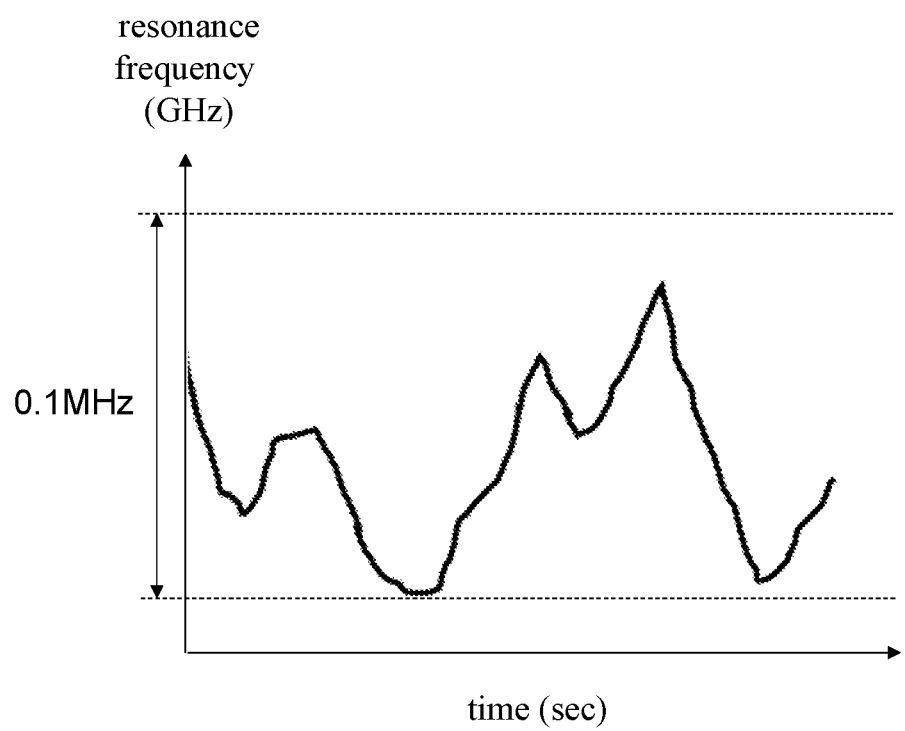
FIG. 8 is a drawing showing the relation between the time and the resonance frequency in a state that a scale of the vertical axis indicating the frequency is excessively enlarged.

In Step S7, the frequency width shown in the vertical axis of the graph is 1 MHz as shown in FIG. 7C. It is not required to reduce the width (enlarge the vertical axis) more than the required accuracy of the resonance frequency. Namely, the lower limit value is specified to the frequency width. In case of the embodiment 1, with respect to the shift amount of the resonance frequency of approximately 100 MHz, the lower limit value is specified to be 1 MHz which is approximately 1% of the shift amount. FIG. 8 is an example where the scale of the vertical axis is excessively enlarged and the frequency width shown in the vertical axis is specified to be 0.1 MHz. As shown in FIG. 8, when the vertical axis is excessively enlarged, the change of the resonance frequency caused by the minute change of the sample 25 is excessively displayed and it becomes rather difficult to determine whether or not the position adjustment of the sample 25 is finished. Therefore, in the embodiment 1, in the graph showing the measurement result of the resonance frequency in Step S8 of FIG. 6, the lower limit value of the frequency width shown in the vertical axis is specified to 1 MHz as shown in FIG. 7C.

As described above, in order to adjust the position of the sample 25, the dielectric characteristic measurement system 100 repeatedly performs the resonance measurement (second and subsequent resonance measurement) by specifying the resonance frequency obtained in the previous resonance measurement to the center frequency of the next resonance measurement and setting 2 times of the 3 dB band width $BW_{3dB}$ of the resonance characteristics obtained in the previous resonance measurement to the sweep frequency width of the next resonance measurement to determine the sweep frequency range. In the second and subsequent resonance measurements, the number of the measurement points with respect to the sweep frequency width is specified to 20 points and each of the second and subsequent resonance measurements is performed with the sweep time of less than 0.05 seconds.

If the number of the measurement points is reduced, the sweep speed increases and the time before the next resonance measurement is shortened. Thus, the updating speed of the repeatedly performed resonance measurement is increased (real time property is improved) and the following property is improved. Namely, the resonance frequency is reflected in the sweep frequency range in the repeatedly performed resonance measurement. On the other hand, the interval of the frequency becomes large and the resolution of the frequency becomes small. In addition, if the sweep frequency width is narrowed, the interval of the frequency to be measured becomes small. Thus, although the resolution of the frequency becomes large, the following property is deteriorated. Namely, in order to adjust the position of the sample 25 precisely, it is required to satisfy three conditions of the real time property, the resolution of the frequency and the following property. Thus, the combination between the sweep frequency width and the number of the measurement points is important.

In the dielectric characteristic measurement system 100, the above described three conditions are satisfied in the repeatedly performed resonance measurement by specifying 2 times of the 3 dB band width $BW_{3dB}$ to the sweep frequency width of 20 points of the measurement points. Namely, since 2 times of the 3 dB band width $BW_{3dB}$ is specified as the sweep frequency width of 20 measurement points, the resonance measurement can be performed with the interval of the frequency capable of obtaining the sufficient resolution of the frequency. Since one sweep is performed less than 0.05 seconds and the updating speed can be sufficiently fast, the operator can perform the position adjustment with real-time feeling. Consequently, the resonance measurement can be performed in a state that the resonance frequency varied in accordance with the shift of the position of the sample 25 does not deviate from the sweep frequency range. As described above, it is found that the above described three conditions can be satisfied by setting the parameters (the number of the measurement points and the sweep frequency width) related to the resonance measurement repeatedly performed for adjusting the position of the sample 25.

In the above described example, in the second and subsequent resonance measurements, the number of the measurement points is specified to be 20 points so that the sweep time becomes 0.05 seconds or less and the sweep frequency width is specified to be 2 times of the 3 dB band width of the resonance waveform measured in the previous resonance measurement. However, the values of the number of the measurement points and the sweep frequency width are not limited to the above described values. The sweep time can be any values as long as the position of the sample 25 can be adjusted in a real time. Here, the real time means the situation that the time required for updating the display of the monitor in accordance with the movement of the position of the sample 25 is sufficiently shorter than the time required for the operator to operate the micrometer 22 by hand to adjust the position of the sample 25 and visually confirm the result on the monitor when the operator visually confirms the display of the monitor, operates the micrometer 22 based on the display, and moves the position of the sample 25. Accordingly, it is possible to specify the number of the measurement points so that the sweep time becomes 0.2 seconds or less (preferably 0.1 seconds or less) in accordance with the movement speed of the position of the sample 25 by the operation of the micrometer 22, for example. In addition, it is also possible to specify the sweep frequency width within the range of 1 to 10 times (predetermined band width) of the 3 dB band width as long as the resonance frequency varied in accordance with the position adjust of the sample 25 does not deviate from the range of the sweep frequency width. As described above, the combination of the number of the measurement points and the sweep frequency width can be changed depending on the properties of the sample 25 of which the dielectric characteristic is measured and the movement speed of the position of the sample 25 by the operation of the micrometer 22.

INDUSTRIAL APPLICABILITY

The dielectric characteristic measurement method and the dielectric characteristic measurement system using the open resonator of the present invention is suitable for measuring the dielectric characteristic of the dielectric material in a high frequency band with high accuracy.

DESCRIPTION OF THE REFERENCE NUMERALS

10: fixing stand
11: first spherical reflection mirror
12: second spherical reflection mirror
15: first waveguide
16: second waveguide
20: sample stand
21: through hole
22: micrometer
25: sample
30: cover
100: dielectric characteristic measurement system
110: Fabry-Perot resonator
120: network analyzer
130: controller
$BW_{3dB}$: 3 dB band width
D0: distance
DP: number of measurement points
$F_c$: center frequency
$F_{res}$: resonance frequency
$F_{span}$: sweep frequency width

The invention claimed is:

1. A dielectric characteristic measurement method for measuring dielectric characteristic of a sample using an open resonator while adjusting a position of the sample, the method comprising:
   a step of obtaining first resonance characteristic in a state that the sample is not mounted on the open resonator;
   a step of mounting the sample on the open resonator and adjusting the position of the sample;
   a step of obtaining second resonance characteristic in a state that the position of the sample is adjusted; and
   a step of calculating the dielectric characteristic of the sample based on the first resonance characteristic and the second resonance characteristic, wherein
   the step of adjusting the position of the sample includes:
      a first measurement step for performing a first resonance measurement by sweeping a predetermined sweep frequency range at a first number of measurement points; and
      a second and subsequent measurement steps for performing a plurality times of resonance measurement following the first resonance measurement,
   each of the plurality times of resonance measurement is performed by sweeping a sweep frequency range specified based on an immediately preceding resonance measurement at a second number of the measurement points which is less than the first number of the measurement points, and
   the sweep frequency range of a second resonance measurement in the plurality times of resonance measurement is specified based on the first resonance measurement.

2. The dielectric characteristic measurement method according to claim 1, wherein
   the step of adjusting the position of the sample includes a display step for displaying a relation between a time and a resonance frequency measured in the second and subsequent measurement steps.

3. The dielectric characteristic measurement method according to claim 2, wherein
   in the display step, the relation between a most recent predetermined time and the resonance frequency measured in the second and subsequent measurement steps is displayed.

4. The dielectric characteristic measurement method according to claim 2, wherein
   in the display step, a frequency width in an axis indicating the resonance frequency measured in the second and subsequent measurement steps has a predetermined lower limit value.

5. The dielectric characteristic measurement method according to claim 1, wherein
   the sweep frequency range corresponding to each of the plurality times of resonance measurement is specified based on the resonance frequency of a resonance waveform measured in an immediately preceding resonance measurement and a predetermined band width.

6. The dielectric characteristic measurement method according to claim 1, wherein
   a time required for performing each of the plurality times of resonance measurement is 0.2 seconds or less.

7. The dielectric characteristic measurement method according to claim 1, wherein
   the second number of the measurement points is equal to or less than one-twentieth of the first number of the measurement points.

8. A dielectric characteristic measurement system configured to perform the dielectric characteristic measurement method according to claim 1, the system comprising:
   the open resonator having a sample stand on which the sample is mounted to measure a dielectric characteristic of the sample, a signal injection portion and a signal detection portion;
   a network analyzer configured to perform a resonance measurement by transmitting a signal to the signal injection portion and receiving the signal from the signal detection portion; and
   a controller configured to control the network analyzer.

* * * * *